US006836024B2

(12) United States Patent
Mori et al.

(10) Patent No.: US 6,836,024 B2
(45) Date of Patent: Dec. 28, 2004

(54) APPARATUS FOR CONNECTING BETWEEN SUBSTRATES

(75) Inventors: Chikaomi Mori, Yamaga (JP); Hirotada Takahashi, Kumamoto-ken (JP); Masao Kawata, Kumamoto (JP); Kenichi Nojiri, Yamaga (JP)

(73) Assignee: Nihon Denshizairyo Kabushiki Kaisha, Amagasaki (JP)

(*) Notice: Subject to any disclaimer, the term of this patent is extended or adjusted under 35 U.S.C. 154(b) by 0 days.

(21) Appl. No.: 10/430,379

(22) Filed: May 7, 2003

(65) Prior Publication Data

US 2004/0222535 A1 Nov. 11, 2004

(51) Int. Cl.[7] ......................... H01L 23/48; H01L 23/52; H01L 29/40

(52) U.S. Cl. ....................................... 257/780; 257/781

(58) Field of Search ................................ 257/780, 781, 257/726, 727

(56) References Cited

U.S. PATENT DOCUMENTS 5,199,889 A * 4/1993 McDevitt, Jr. ............... 439/66
5,437,556 A * 8/1995 Bargain et al. ............... 439/66
6,608,385 B2 * 8/2003 Zhou et al. ................. 257/773

* cited by examiner

*Primary Examiner*—Phat X. Cao
(74) *Attorney, Agent, or Firm*—Armstrong, Kratz, Quintos, Hanson & Brooks, LLP

(57) ABSTRACT

The present invention aims to provide an apparatus for connecting between substrates capable of replacing a connector one by one.

An apparatus for connecting between substrates A is provided with a connector 100 for electrically connecting an upside electrode 11 mounted at the back surface of an upside substrate 10 and a downside electrode 21 mounted at the front surface of a downside substrate 20 in a personal computer and a supporting plate 200 arranged between the upside substrate 10 and the downside substrate 20 for removably supporting the connector 100, and the connector 100 is able to be inserted into a positioning hole formed on the supporting plate 200 and has a mounting terminal 110 having a leading edge section being in contact with the downside electrode 21 and a connecting section 120 mounted at a base edge section of the mounting terminal 110 and having a leading edge section being in contact with the upside electrode 11.

8 Claims, 4 Drawing Sheets

A Apparatus for connecting between substrates

B Apparatus for connecting between substrates

APPARATUS FOR CONNECTING BETWEEN SUBSTRATES

BACKGROUND OF THE INVENTION

1. Field of the Invention

The present invention relates to an apparatus for connecting between substrates for electrically connecting substrates having an electrode provided thereon.

2. Prior Art

As shown in FIG. 4, a conventional apparatus for connecting between substrates B has elastic connectors 110, 110 for electrically connecting an upside electrode 11 and a downside electrode 21 and a substrate 200 arranged between an upper upside substrate 10 and a lower downside substrate 20 and having the connectors fixed onto the front and back surfaces thereof coaxially, whereby it electrically connects the upside electrode 11 on the upside substrate 10 and the downside electrode 21 on the downside substrate 20.

However, the connectors 110, 110 are perfectly fixed onto the substrate 200 in the apparatus for connecting between substrates B, having a drawback that the connectors 110, 110 cannot be replaced one by one even if the connectors 110, 110 are damaged so that they are required to be replaced.

SUMMARY OF THE INVENTION

The present invention is accomplished in view of the above-mentioned circumstances, and aims to provide an apparatus for connecting between substrates capable of replacing a connector one by one.

An apparatus for connecting between substrates of the present invention is provided with a connector for electrically connecting an upside electrode mounted at the back surface of an upside substrate and a downside electrode mounted at the front surface of a downside substrate and a supporting plate arranged between the upside substrate and the downside substrate for removably supporting the connector, wherein the connector is able to be inserted into a positioning hole formed on the supporting plate and has a mounting terminal having a leading edge being in contact with the downside electrode and a connecting section mounted at a base edge section of the mounting terminal and having a leading edge being in contact with the upside electrode.

The connecting section is more preferably elastic and has a leading edge urged into contact with the upside electrode.

The connecting section is more preferably shaped approximately like a fishhook seen from the side.

The positioning hole is more preferably formed slightly greater than the mounting terminal in order to facilitate the removal of the connector from the supporting plate.

The mounting terminal is more preferably two-forked to have an approximately inverted U-shape.

A protrusion section is more preferably provided at the side of the leading edge of the mounting terminal for preventing the connector from falling from the supporting plate.

DESCRIPTION OF THE PREFERRED EMBODIMENTS

Figure 1:
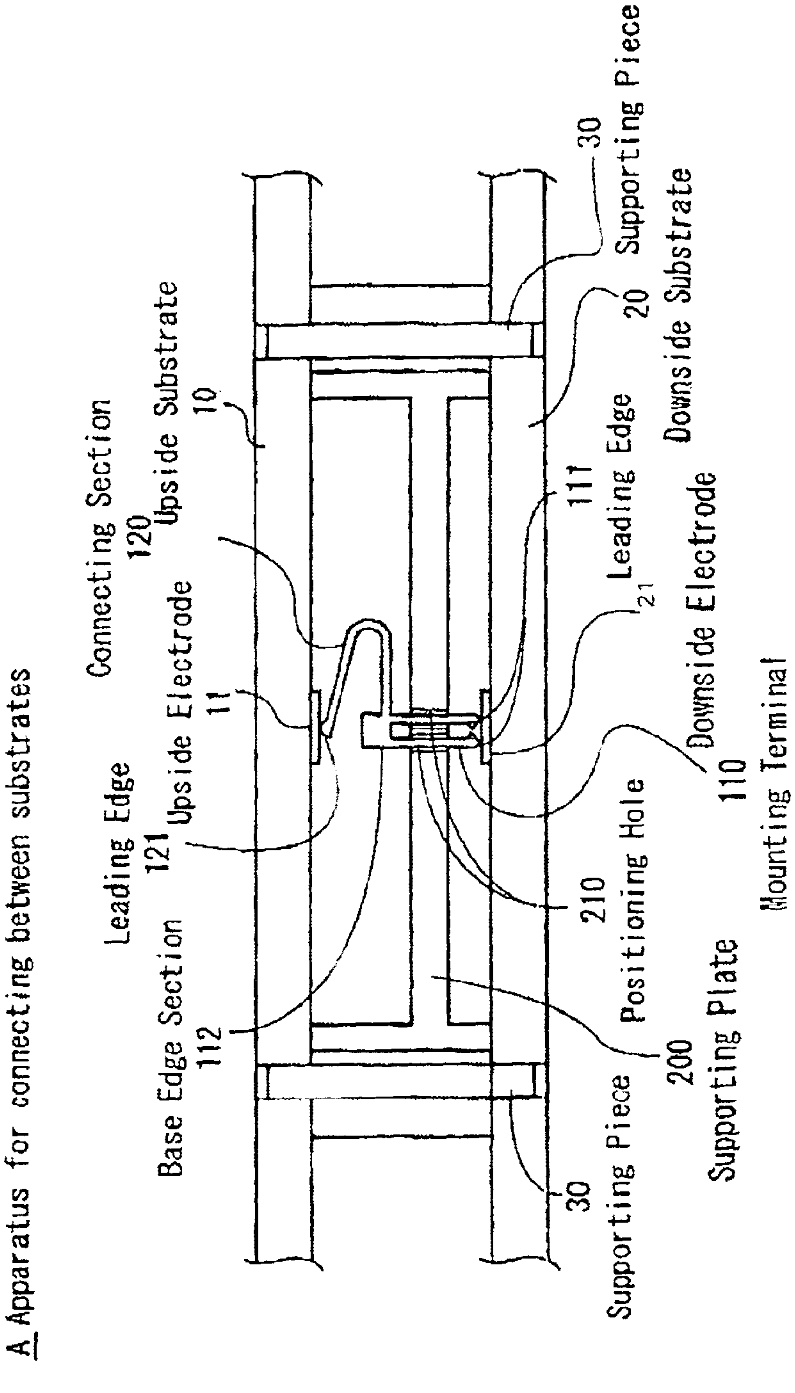
FIG. 1 is a schematic sectional view showing a state of use of an apparatus for connecting between substrates according to an embodiment of the present invention.
Figure 2:
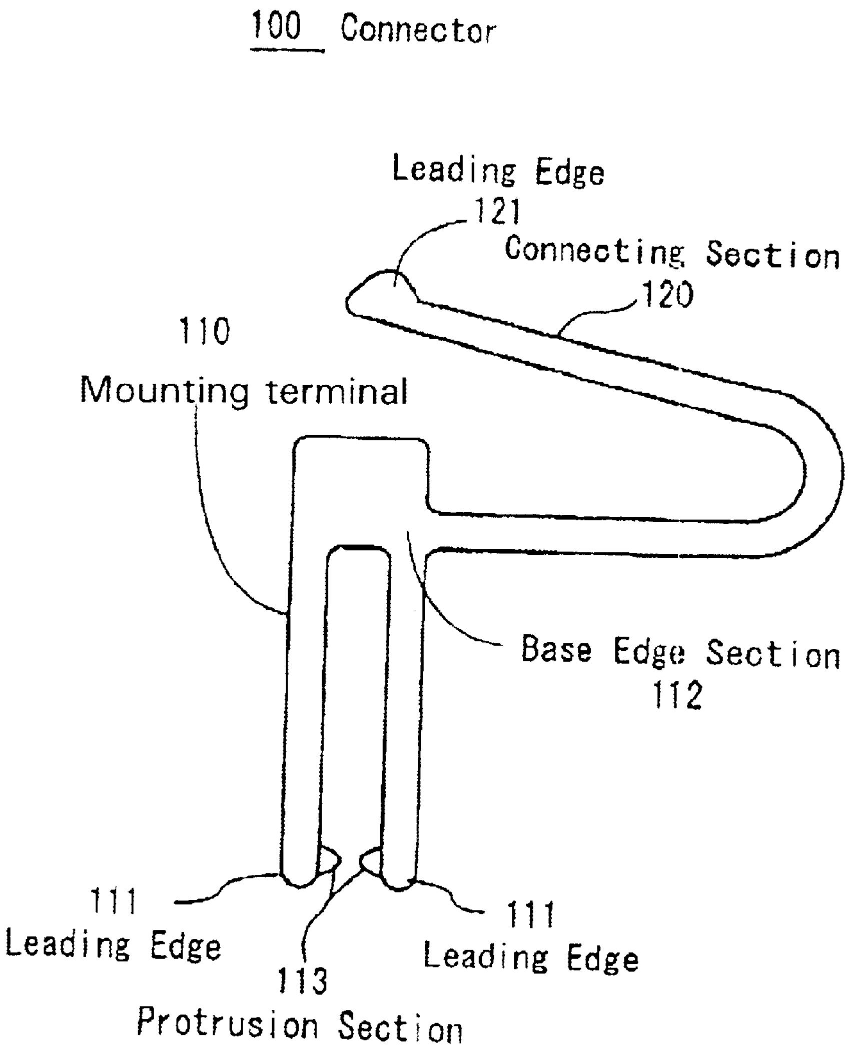
FIG. 2 is a schematic side view of a connector of the apparatus for connecting between substrates.

An apparatus for connecting between substrates according to an embodiment of the invention will be explained with reference to the drawings. FIG. 1 is a schematic sectional view showing a state of use of an apparatus for connecting between substrates according to the embodiment of the invention, FIG. 2 is a schematic side view of a connector of the apparatus for connecting between substrates, and FIG. 3 is a schematic top view of the apparatus for connecting between substrates.

An apparatus for connecting between substrates A described here is provided with a connector 100 for electrically connecting an upside electrode 11 mounted at the back surface of an upside substrate 10 and a downside electrode 21 mounted at the front surface of a downside substrate 20 in a personal computer and a supporting plate 200 arranged between the upside substrate 10 and the downside substrate 20 for removably supporting the connector 100, wherein the connector 100 is able to be inserted into a positioning hole 210 formed on the supporting plate 200 and has a mounting terminal 110 having a leading edge 111 being in contact with the downside electrode 21 and a connecting section 120 mounted at a base edge section 112 of the mounting terminal 110 and having a leading edge 121 being in contact with the upside electrode 11. Detailed explanation is as follows.

A supporting piece 30 is attached to the substrate 10 and the substrate 20 for fixing them at a predetermined space.

Figure 3:
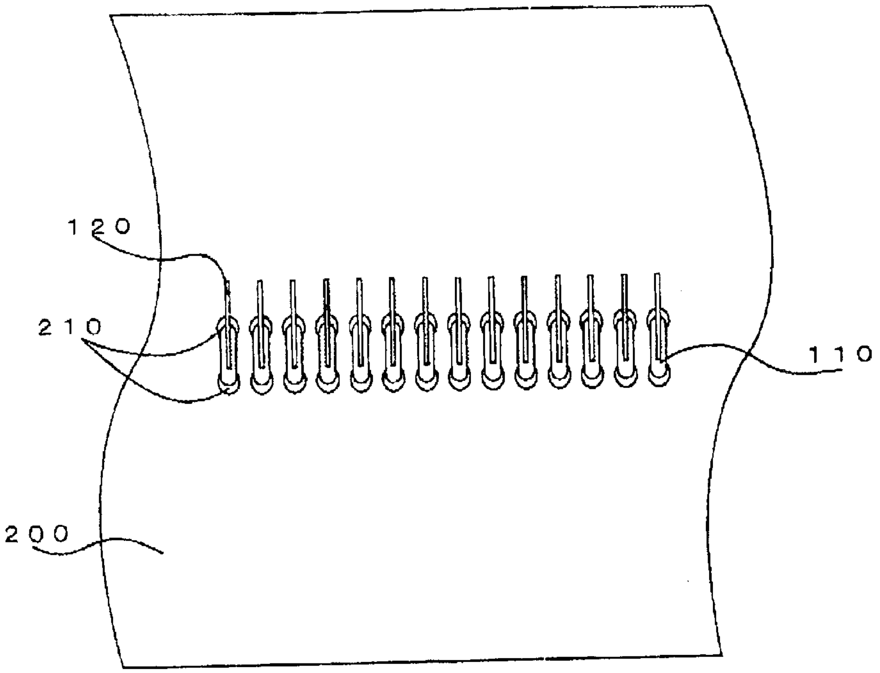
FIG. 3 is a schematic top view of the apparatus for connecting between substrates.
Figure 4:
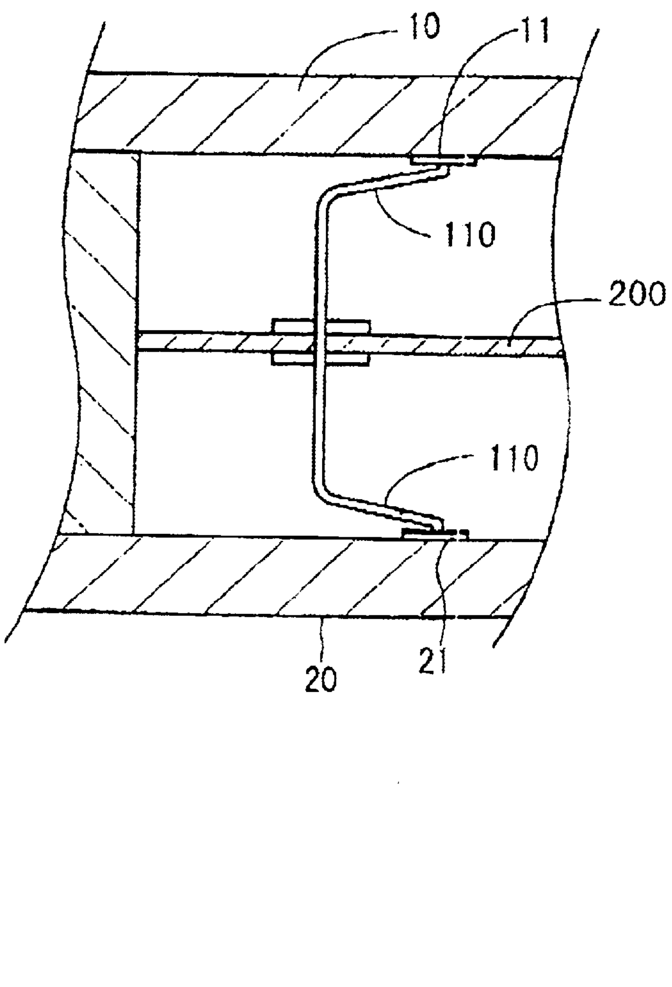
Fig. 4 Prior Art
FIG. 4 is a schematic sectional view showing a conventional apparatus for connecting between substrates.

The connector 100 is a formed product wherein the mounting terminal 110 and the connecting section 120 are integrally molded, and as shown in FIG. 3, a plurality of connectors (14 connectors shown in the figure) are mounted at the supporting plate 200.

The mounting terminal 110 is two-forked to have an approximately inverted U-shape for preventing from falling from the supporting plate 200. The leading edge 111 of the mounting terminal 110 is brought into electrical contact with the downside electrode 21 of the downside substrate 20, while the base edge section 112 has the connecting section 120 extended therefrom, the leading edge 121 of which is brought into contact with the upside electrode 11 of the upside substrate 10. This establishes an electrical contact between the upside electrode 11 and the downside electrode 21.

Further, protrusion sections 113, 113 are provided at the inside of the leading edge of the two-forked mounting terminal 110. Engaging the Protrusions 113, 113 with the positioning hole 210 can prevent the connector 100 from falling from the supporting plate 200.

The connecting section 120 is elastic and has an approximately like a fishhook shape seen from the side, wherein the leading edge 121 is urged into contact with the upside electrode 11. This can provide a constant contact pressure between the upside electrode 11 and the downside electrode 21 at all times.

The supporting plate 200 is a plate for supporting the connector 100 as shown in FIG. 3, and attached between the upside substrate 10 and the downside substrate 20. A plurality of positioning holes 210 (14 holes in the figure) that are through-holes are formed on the surface of the supporting plate 200. The positioning hole 210 has two openings corresponding to the two-forked mounting terminal 110 and formed slightly greater than the mounting terminal 110 for facilitating the removal of the connector 100 from the supporting plate 200.

The positioning holes 210 are arranged to a position where the connector 100 can be brought into contact with the upside electrode 11 and the downside electrode 21.

Subsequently explained is a method for installing the apparatus for connecting between substrates A to the upside substrate 10 and the downside substrate 20.

Firstly, the connector 100 is attached to the supporting plate 200.

The supporting plate 200 of this state is installed between the upside substrate 10 and the downside substrate 20, and the supporting piece 30 is attached to the upside substrate 10 and the downside substrate 20, whereby the mounting terminal 110 is brought into contact with the downside electrode 21 as well as the connecting section 120 is urged into contact with the upside electrode 11.

In case where the connector 100 is replaced due to a breakdown or a damage, the supporting piece 30 is removed from the upside substrate 10 and the downside substrate 20, and then, the upside substrate 10 is removed.

Thereafter, the connector 100 having a breakdown is removed from the supporting plate 200 for replacing with a new connector 100.

According to the apparatus for connecting between substrates A, it is attached to the supporting plate 200 by the mounting terminal 110, thereby being capable of easily replacing the connector 100 one by one. Therefore, all connectors 100 do not have to be replaced even if a single connector 100 is broken down, thereby providing a merit for aiming low cost. Further, the elastic connecting section 120 enables to establish a constant contact pressure between the upside electrode 11 and the downside electrode 21, bringing also about an effect of extremely stabilized connecting state between the electrodes. A design change as described hereinbelow is possible.

Although the mounting terminal 110 has two-forked section, a design change is made possible such that it is formed to have a three, four or more forked section, or such that it is formed to be a single rod-like member. A design change of the positioning hole 210 is made possible with the above-mentioned design change.

Although the protrusion sections 113,113 are provided at both ends of the two-forked section of the mounting terminal 110, the protrusion section 113 may be provided at one end of the two-forked section, or the protrusion section 113,113 may not be provided. The protrusion sections 113, 113 may be provided not only at the inside of the leading edge of the mounting terminal 110, but also at the outside thereof.

Although the connecting section 120 is an elastic member having like a fishhook shape, it can be changed to a rod-like member that can be brought into contact with the upside electrode Although the apparatus for connecting between substrates A serves to electrically connect the electrodes between the substrates in a personal computer, it is not limited to the personal computer. The apparatus for connecting between substrates A, for example, can also be used for electrically connecting electrodes between IC substrates of an IC socket or the like.

An apparatus for connecting between substrates of the present invention is provided with a connector for electrically connecting an upside electrode mounted at the back surface of an upside substrate and a downside electrode mounted at the front surface of a downside substrate and a supporting plate arranged between the upside substrate and the downside substrate for removably supporting the connector, wherein the connector is able to be inserted into a positioning hole formed on the supporting plate and has a mounting terminal having a leading edge being in contact with the downside electrode and a connecting section mounted at a base edge section of the mounting terminal and having a leading edge being in contact with the upside electrode.

Accordingly, in the case of such an apparatus for connecting between substrates, the mounting terminal is able to be inserted into the positioning hole formed on the supporting plate, whereby the connector can be replaced one by one.

Therefore, it is unnecessary to replace all of the connectors as conventionally even when one connector is broken down, thereby being capable of reducing cost from this viewpoint.

Further, the connecting section is an elastic member, the leading edge of which is urged into contact with the upside electrode. Moreover, it is formed to have an approximately like a fishhook shape seen from the side, thereby providing a constant contact pressure between the upside electrode and the downside electrode, resulting in bringing about an effect of extremely stabilized connection state between the electrodes.

Additionally, the positioning hole is formed slightly greater than the mounting terminal in order to facilitate the removal of the connector from the supporting plate, and the mounting terminal is two-forked to have an approximately inverted U-shape, whereby the connector can easily be removed from the supporting plate.

It is to be noted that a protrusion section is provided at the side of the leading edge of the mounting terminal for preventing the connector from falling from the supporting plate, whereby the protrusion section is engaged with the positioning hole to thereby be capable of preventing the connector from falling from the supporting plate.

What is claimed is:

1. An apparatus for connecting between substrates provided with a connector for electrically connecting an upside electrode mounted at the back surface of an upside substrate and a downside electrode mounted at the front surface of a downside substrate and a supporting plate arranged between the upside substrate and the downside substrate for removably supporting the connector, wherein the connector is able to be inserted into a positioning hole formed on the supporting plate;

has a mounting terminal having a leading edge being in contact with the downside electrode; and has a connecting section, mounted at a base edge section of the mounting terminal, having a leading edge being in contact with the upside electrode;

said mounting terminal being arranged in said positioning hole so as to have said base edge section, said connecting section, and said leading edge of said connecting section disposed entirely in space formed between said supporting plate and said upside substrate.

2. An apparatus for connecting between substrates claimed in claim 1, wherein the connecting section is an elastic member, the leading edge of which is urged in contact with the upside electrode.

3. An apparatus for connecting between substrates claimed in claim 2, wherein the connecting section is shaped approximately like a fishhook seen from the side.

4. An apparatus for connecting between substrates claimed in any one of claims 1, 2 and 3, wherein the positioning hole is formed slightly greater than the mounting terminal in order to facilitate the removal of the connector from the supporting plate.

5. An apparatus for connecting between substrates claimed in any one of claims 1, 2 and 3, wherein a protrusion section is provided at the side of the leading edge of the mounting terminal for preventing the connector from falling from the supporting plate.

6. An apparatus for connecting between substrates, provided with a connector for electrically connecting an upside electrode mounted at the back surface of an upside substrate and a downside electrode mounted at the front surface of a downside substrate, and a supporting plate arranged between the upside substrate and the downside substrate for removably supporting the connector, wherein the connector is able to be inserted into a positioning hole formed on the supporting plate:

has a mounting terminal having a leading edge being in contact with the downside electrode, and has a connecting section, mounted at a base edge section of the mounting terminal, having a leading edge being in contact with the upside electrode;

the mounting terminal being two-forked to have an approximately inverted U-shape.

7. The apparatus for connecting between substrates as claimed in claim 6, wherein the connecting section is an elastic member, the leading edge of which is urged in contact with the upside electrode.

8. The apparatus for connecting between substrates as claimed in claim 7, wherein the connecting section is shaped approximately like a fishhook as seen from the side.

* * * * *